United States Patent
Yu et al.

(10) Patent No.: US 7,119,573 B2
(45) Date of Patent: *Oct. 10, 2006

(54) FIELD-PROGRAMMABLE GATE ARRAY LOW VOLTAGE DIFFERENTIAL SIGNALING DRIVER UTILIZING TWO COMPLIMENTARY OUTPUT BUFFERS

(75) Inventors: Donald Y. Yu, Fremont, CA (US); Wei-Min Kuo, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/123,734

(22) Filed: May 5, 2005

(65) Prior Publication Data

US 2005/0206407 A1    Sep. 22, 2005

Related U.S. Application Data

(63) Continuation of application No. 10/163,096, filed on Jun. 4, 2002, now Pat. No. 6,891,394.

(51) Int. Cl.
*H03K 19/173* (2006.01)
*H03H 11/26* (2006.01)

(52) U.S. Cl. ............................ 326/38; 326/47; 327/278
(58) Field of Classification Search ................... 326/38
See application file for complete search history.

(56) References Cited

U.S. PATENT DOCUMENTS

| | | | |
|---|---|---|---|
| 4,255,748 A | 3/1981 | Bartlett | 340/661 |
| 4,625,313 A | 11/1986 | Springer | 371/20 |
| 4,638,187 A | 1/1987 | Boler et al. | 307/451 |
| 4,638,243 A | 1/1987 | Chan | 324/51 |
| 4,684,830 A | 8/1987 | Tsui et al. | 307/465 |
| 4,700,130 A | 10/1987 | Bloemen | 324/110 |
| 4,706,216 A | 11/1987 | Carter | 365/94 |
| 4,713,557 A | 12/1987 | Carter | 307/242 |
| 4,717,912 A | 1/1988 | Harvey et al. | 340/825.83 |
| 4,718,042 A | 1/1988 | Moll et al. | 365/201 |
| 4,742,252 A | 5/1988 | Agrawal | 307/465 |
| 4,758,745 A | 7/1988 | Elgamal et al. | 307/465 |
| 4,772,812 A | 9/1988 | Desmarais | 307/473 |
| 4,800,176 A | 1/1989 | Kakumu et al. | 437/193 |
| 4,857,774 A | 8/1989 | ElAyat et al. | 307/465 |
| 4,870,300 A | 9/1989 | Nakaya et al. | 307/303 |
| 4,870,302 A | 9/1989 | Freeman | 307/465 |
| 4,873,459 A | 10/1989 | El Gamal et al. | 307/465 |
| 4,928,023 A | 5/1990 | Marshall | 307/443 |
| 4,930,097 A | 5/1990 | Ledenbach et al. | 364/716 |
| 4,935,645 A | 6/1990 | Lee | 307/362 |

(Continued)

FOREIGN PATENT DOCUMENTS

EP    0 415 542 A2    3/1991

(Continued)

OTHER PUBLICATIONS

L. Ashby, "ASIC Clock Distribution using a Phase Locked Loop (PLL)," *Proceedings Fourth Annual IEEE International ASIC Conference and Exhibit*, pp. 6.1-6.3, Sep. 1991.

(Continued)

*Primary Examiner*—James H. Cho
(74) *Attorney, Agent, or Firm*—Sierra Patent Group, Ltd.

(57) ABSTRACT

A low voltage signaling differential signaling driver comprising a first output line coupled to a delay circuit, a first multiplexer and a first output buffer. The first output line is also coupled to an inverter, a second multiplexer and a second output buffer.

1 Claim, 4 Drawing Sheets

U.S. PATENT DOCUMENTS

| | | | |
|---|---|---|---|
| 4,959,561 A | 9/1990 | McDermott et al. | 307/443 |
| 4,978,905 A | 12/1990 | Hoff et al. | 323/314 |
| 5,008,855 A | 4/1991 | Eltoukhy et al. | 365/96 |
| 5,046,035 A | 9/1991 | Jigour et al. | 364/716 |
| 5,083,083 A | 1/1992 | El Ayat et al. | 324/158 R |
| 5,121,394 A | 6/1992 | Russell | 371/22.1 |
| 5,122,685 A | 6/1992 | Chan et al. | 307/465.1 |
| 5,126,282 A | 6/1992 | Chiang et al. | 437/172 |
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,191,241 A | 3/1993 | McCollum et al. | 307/465 |
| 5,198,705 A | 3/1993 | Galbraith et al. | 307/465 |
| 5,208,491 A | 5/1993 | Ebeling et al. | 307/465 |
| 5,208,530 A | 5/1993 | El Ayat et al. | 324/158 R |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,223,792 A | 6/1993 | El Ayat et al. | 324/158 R |
| 5,258,319 A | 11/1993 | Inuishi et al. | 437/35 |
| 5,272,388 A | 12/1993 | Bakker | 307/202.1 |
| 5,286,922 A | 2/1994 | Curtiss | 174/112 |
| 5,293,133 A | 3/1994 | Birkner et al. | 324/713 |
| 5,294,846 A | 3/1994 | Paivinen | 307/465 |
| 5,300,830 A | 4/1994 | Hawes | 307/465 |
| 5,300,832 A | 4/1994 | Rogers | 307/475 |
| 5,304,871 A | 4/1994 | Dharmarajan et al. | 307/465 |
| 5,309,091 A | 5/1994 | El Ayat et al. | 324/158 R |
| 5,317,698 A | 5/1994 | Chan | 395/325 |
| 5,341,092 A | 8/1994 | El Ayat et al. | 324/158 R |
| 5,365,165 A | 11/1994 | El Ayat et al. | 324/158.1 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 326/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,432,441 A | 7/1995 | El Ayat et al. | 324/158.1 |
| 5,451,887 A | 9/1995 | El Ayat et al. | 326/39 |
| 5,455,525 A | 10/1995 | Ho et al. | 326/41 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,495,181 A | 2/1996 | Kolze | 326/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,476 A | 11/1996 | Eltoukhy | 365/210 |
| 5,594,363 A | 1/1997 | Freeman et al. | 326/39 |
| 5,600,262 A | 2/1997 | Kolze | 326/38 |
| 5,600,264 A | 2/1997 | Duong et al. | 326/39 |
| 5,666,322 A | 9/1997 | Conkle | 365/233 |
| 5,670,905 A | 9/1997 | Keeth et al. | 327/333 |
| 5,742,181 A | 4/1998 | Rush | 326/41 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.01 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,832,892 A | 11/1998 | Yaoita | 123/260 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,557 A | 12/1998 | Fincher et al. | 326/38 |
| 5,848,005 A | 12/1998 | Cliff et al. | 365/230.03 |
| 5,848,006 A | 12/1998 | Nagata | 365/230.06 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/39 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,327 A | 2/1999 | Gitlin et al. | 365/96 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,100,715 A | 8/2000 | Agrawal et al. | 326/39 |
| 6,111,448 A | 8/2000 | Shibayama | 327/293 |
| 6,157,213 A | 12/2000 | Voogel | 326/41 |
| 6,181,174 B1 | 1/2001 | Fujieda et al. | 327/158 |
| 6,216,258 B1 | 4/2001 | Mohan et al. | 716/17 |
| 6,242,943 B1 | 6/2001 | El Ayat | 326/39 |
| 6,260,182 B1 | 7/2001 | Mohan et al. | 716/12 |
| 6,289,068 B1 | 9/2001 | Hassoun et al. | 375/376 |
| 6,292,016 B1 | 9/2001 | Jefferson et al. | 326/39 |
| 6,292,925 B1 | 9/2001 | Dellinger et al. | 716/8 |
| 6,329,839 B1 | 12/2001 | Pani et al. | 326/41 |
| 6,353,334 B1 * | 3/2002 | Schultz et al. | 326/82 |
| 6,418,059 B1 | 7/2002 | Kreifels et al. | 365/185.28 |
| 6,430,088 B1 | 8/2002 | Plants et al. | 365/189.04 |
| 6,437,650 B1 | 8/2002 | Sung et al. | 331/25 |
| 6,480,026 B1 * | 11/2002 | Andrews et al. | 326/39 |
| 6,496,887 B1 | 12/2002 | Plants | 710/100 |
| 6,501,295 B1 | 12/2002 | Burr | 326/38 |
| 6,734,702 B1 * | 5/2004 | Ikeoku et al. | 326/30 |
| 6,891,394 B1 * | 5/2005 | Yu et al. | 326/38 |

FOREIGN PATENT DOCUMENTS

| | | |
|---|---|---|
| EP | 0 415 542 A3 | 10/1991 |
| EP | 0 889 593 A1 | 1/1999 |
| EP | 1 137 188 A2 | 9/2001 |

OTHER PUBLICATIONS

"AV9170 Clock Synchronizer and Multiplier," pp. 1-4, Nov. 8, 1992.

"AV9170 Application Note," AvaSem, pp. 1-7, Jan. 1993.

U. Ko, "A 30-ps JITTER, 3.6-μs Locking, 3.3-Volt Digital PLL for CMOS Gate Arrays," *IEEE 1993 Custom Integrated Circuits Conference*, pp. 23.3.1-23.3.4, Conf. Date: May 9-12, 1993.

A. Efendovich et al., "Multi-Frequency Zero-Jitter Delay-Locked Loop, " *IEEE 1993 Custom Integrated Circuits Conference*, pp. 27.1.1-27.1.4, Conf. Date: May 9-12, 1993.

R. Quinnell, "Blending gate arrays with dedicated circuits sweetens ASIC development," EDN, pp. 29-32, Mar. 31, 1994.

J. Chen, "PLL-based clock systems span the system spectrum from green PCs to Alpha," EDN, pp. 147-148, 150, 152, 154-155, Nov. 9, 1995.

P. Sevalia, "Straightforward techniques cut jitter in PLL-based clock drivers," EDN, pp. 119-123, 125, Nov. 23, 1995.

D. Bursky, "Memories Hit New Highs And Clocks Run Jitter-Free," Electronic Design, pp. 79-80, 84-85, 89-93, Feb. 19, 1996.

"Using ACT 3 Family I/O Macros," Actel Corp. Application Note, pp. 4-51-4-56, Apr. 1996.

"Virtex-E High Performance Differential Solutions: Low Voltage Differential Signaling (LVDS)," Xilinx, Corp., pp. 1-7, Dec. 1999.

"Data Width Conversion FIFOs Using the Virtex Block Select RAM Memory," Xilinx, Corp. application Note: Virtex Series, XAPP205 (v1.3), pp. 1-6, Aug. 2000.

"Virtex™-E1.8V Field Programmable Gate Arrays," DS022-1 (v2.3) Production Product Specification, Xilinx Corp., pp. 1-102, Jul. 17, 2002.

US 6,564,273, 05/2003, Plants (withdrawn)

\* cited by examiner

FIELD-PROGRAMMABLE GATE ARRAY LOW VOLTAGE DIFFERENTIAL SIGNALING DRIVER UTILIZING TWO COMPLIMENTARY OUTPUT BUFFERS

CROSS-REFERENCE TO RELATED APPLICATION

This application is a continuation of U.S. patent application Ser. No. 10/163,096, filed Jun. 4, 2002 is now a U.S. Pat. No. 6,891,394, which is hereby incorporated by reference as if set forth herein.

BACKGROUND OF THE INVENTION

1. Field of the Invention

The present invention relates to field-programmable gate arrays, and more particularly, to a low voltage differential signaling driver for field programmable gate arrays.

2. Description of the Related Art

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

Almost all integrated circuits use input/output (I/O) buffers to connect internal circuit nodes to other circuits external to the integrated circuit. These I/O buffers can be input, output or bi-directional I/O buffers. Further, each I/O buffer may be designed to meet electrical specifications dictated by industry standards such as TTL, LVTTL, LVCMOS, GTL. It is also common for circuit designers to design each I/O buffer with multiple transistors in parallel. For example, 2–4 P-type transistors may be connected in parallel to form the pull-up section of the buffer, while 2–4 N-type transistors may be connected in parallel to form the pull down section of the buffer. Designers may then decide to use some or all of the transistors as needed by the circuit application to meet performance criteria, a particular I/O standard and noise considerations.

The selection of the transistors connected into the circuit is usually done by masking options such as metal, vias and contacts. Moreover, some FPGAs have used similar techniques to select one or more transistors into the I/O buffer to provide slew control. A user may configure his I/O buffer to have either fast slew or slow slew by programming an appropriate antifuse element. This feature allows the user control over speed and noise that is induced into the circuit by the switching I/O buffers.

Different types of FPGAs designed by various manufacturers also feature configurable I/O buffers. These FPGAs may feature highly configurable input and output buffers, which provide support for a wide variety of I/O standards. Input buffers can be configured as either a simple buffer or as a differential amplifier input. Output buffers can be configured as either a push-pull output or as an open drain output. Selection of the desired standard is done by configuration memory bits. Further, different power supplies are provided to the I/O buffer as needed by the standard.

Hence, there is a need for an I/O that has an output buffer which can function as a low voltage differential signaling driver when used together with an adjacent output buffer.

BRIEF SUMMARY OF THE INVENTION

The present system provides a low voltage differential signaling (LVDS) driver for a field programmable gate array (FPGA). The FPGA includes a first FPGA tile, and the first FPGA tile includes a plurality of input/output cells. Adjacent positive input/output cells and negative input/output cells are used to form the low voltage signaling differential driver of the present invention.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
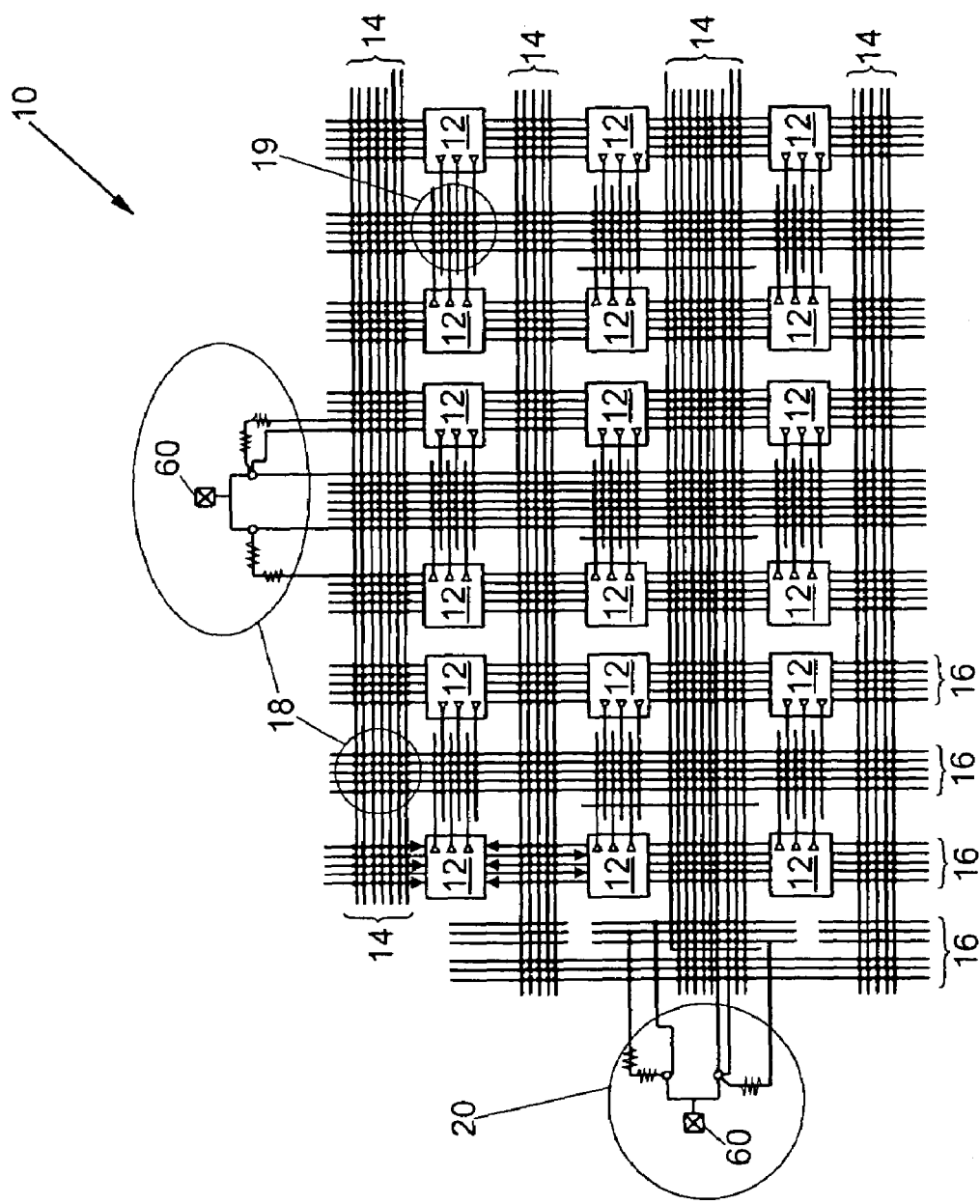
FIG. 1 is a simplified block diagram illustrating an FPGA architecture in accordance with the present invention.

Referring first to FIG. 1, a simplified block diagram of a field-programmable gate array (FPGA) core architecture 10 is shown. As used herein the term "core architecture" refers to the architecture of the core of an FPGA which comprises a plurality of logic function circuits or modules (reference numeral 12) arranged in a matrix with an overlay of interconnect architecture including interconnect conductors and user-programmable interconnect elements. Logic function modules 12 may comprise any variety of circuits, either combinatorial logic, sequential logic, or combinations thereof, and need not be identical.

As shown in FIG. 1, logic modules 12 are disposed in a network of interconnect conductors. In order to avoid over-complicating the figure and rendering it more difficult to comprehend, those of ordinary skill in the art will recognize that the network of interconnect conductors are shown in simplified schematic form, as will be recognized by those of ordinary skill in the art. In addition while the drawing shows the interconnect conductors running between the logic function circuits, those of ordinary skill in the art will readily recognize that the architecture may be a "sea of gates" type architecture where the interconnect conductors actually run directly over, rather than between, the logic function circuits. The interconnect conductors may comprise metal lines in layers disposed over the layers which constitute the logic function circuits.

Such a "sea of gates" architecture is known in the art and is exemplified by U.S. Pat. No. 5,132,571 to McCollum et al. and permits the fabrication of a more dense array than an architecture in which the interconnect conductors run only between the logic function circuits. While such a "sea of gates" architecture is preferred, those of ordinary skill in the art will recognize that the principles of the present invention apply equally to any type of programmable array architecture.

FIG. 1 depicts an interconnect architecture comprising a plurality of horizontal and vertical channels of interconnect conductors. Horizontal channels are represented by numeral 14 and vertical channels are represented by the numeral 16. Those of ordinary skill in the art will appreciate that each channel will comprise a plurality of individual interconnect conductors, some of which may be segmented and some of which may run the length (or width) of the array. The number of interconnect conductors present in each channel in any actual integrated circuit which embodies the present invention will be dictated by individual design choice, based upon factors such as array size and density.

In order to provide for a rich potential of interconnect choices, the intersections of selected ones of the individual conductors horizontal and vertical interconnect channels are populated with user programmable interconnect elements which may be programmed by the user to make electrical connections between selected ones of them to implement connections nets between the inputs and outputs of the logic function circuits. Groups of such user programmable interconnect elements at the intersections of the horizontal and vertical interconnect channels are shown, as an example, at intersection 18. Inputs and outputs of logic function circuits are also connected to selected ones of the interconnect conductors in the channels by user-programmable interconnect elements disposed at the intersections of the individual inputs and outputs and selected ones of the interconnect conductors in the channels as shown schematically by squares 19.

There are a number of available user-programmable interconnect technologies that may be employed in the architecture of the present invention. These include such elements as antifuse and active devices such as pass transistors. Such devices, their implementation, and the circuitry necessary to program them, are well known to those of ordinary skill in the art. The details of these known devices will not be set forth herein to avoid overcomplicating the disclosure and thus obscuring the nature of the present invention. As shown in greater detail below, an LDVS driver is formed by using two adjacent output buffers. Each adjacent output buffer has a multiplexer associated with it. A multiplexer control element is used to determine whether the adjacent I/O buffers will function independently or together as a low voltage differential signaling driver. The ability of the I/O buffer to act as either a single ended output or a low voltage differential signaling driver provides for an extremely flexible device.

The core architecture of FPGA 10 communicates off chip by means of a plurality of input/output (I/O) modules 20. Illustrative I/O modules 20 are shown coupled between I/O pads 60 and horizontal interconnect channels 14 and vertical interconnect channels 16. As will be appreciated by those of ordinary skill in the art, I/O modules each comprise an input buffer, an output buffer and input/output selection circuitry, as will be disclosed in more detail herein with respect to the present invention.

Low voltage differential signaling (LVDS) drivers can be used in an FPGA architecture to enhance its performance. Low voltage differential signaling drivers are high speed and low noise point to point links. For example, in instances when the output wire from the I/O buffer of the integrated circuit to the external component or components is of an extended length, a low voltage differential signal driver is used for its ability to drive the signal along a transmission line for long distances at a high speed. In addition, the use of a differential driver reduces the noise inherent with a single signal input. Thus, low voltage differential signaling results in fast data transmission, common mode noise rejection and low power consumption over a broad frequency range.

Figure 2:
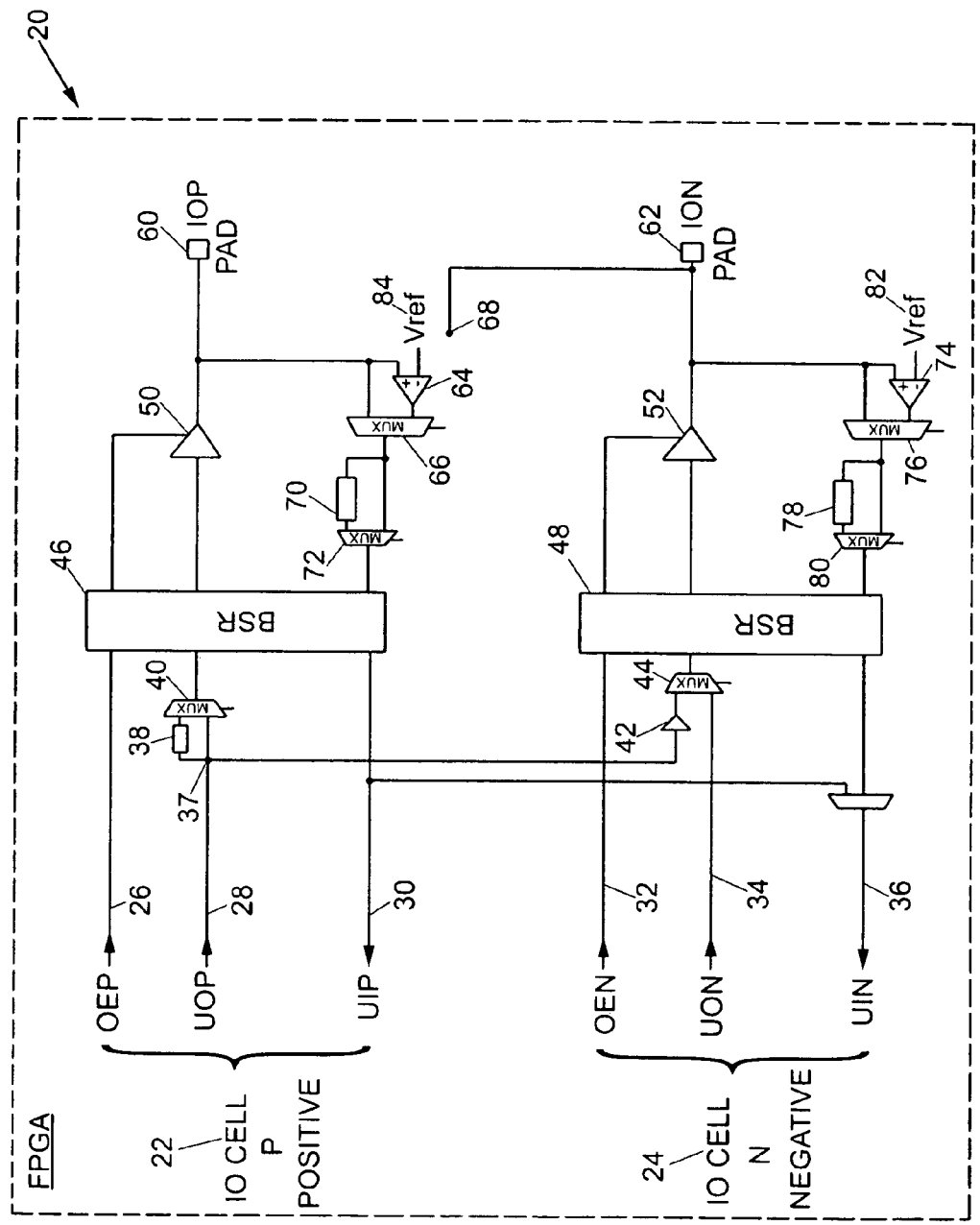
FIG. 2 is a block diagram illustrating in further detail two I/O cells as shown in FIG. 1.

FIG. 2 discloses in further detail I/O modules 20 of the present invention. I/O module 20 comprises adjacent positive I/O cell 22 and negative I/O cell 24. Positive I/O cell 22 has three input and output ports 26, 28 and 30. Input and output ports 26, 28 and 30 include a positive output enable port 26 which receives an enable signal line from the FPGA core, a positive output data port 28 which receives a data signal line from the FPGA core and a positive input data port which sends a data signal line into the FPGA core. Negative I/O cell 24 has three input and output ports 32, 34 and 36. Input and output ports 32, 34 and 36 include a negative output enable port 32 which receives an enable signal line from the FPGA core, a negative output data port 34 which receives a data signal line from the FPGA core and a negative input data port 36 which sends a data signal line into the FPGA core.

Positive I/O cell 22 also includes delay circuit 38 and multiplexer 40. Positive output data line 28 is coupled directly to multiplexer 40 or coupled indirectly to multiplexer 40 through delay circuit 38 by programming programmable element 37. Programmable element 37 may be any programmable element known to those of ordinary skill in the art. Also included in positive I/O cell 22 is boundary scan register 46. Boundary scan register 46 is only used in testing mode to determine whether the I/O circuitry is functioning as programmed. In normal mode boundary scan register 46 is bypassed. An output buffer 50 is used to drive the signal received by output buffer 50 from multiplexer 40 to positive I/O pad 60. Delay circuit 38, multiplexer 40 and output buffer 50 form the low voltage signaling driver (LVDS) driver of the present invention. The LVDS driver is discussed in greater detail below.

Also shown is positive input data line 30 which carries signals between positive I/O pad 60 and the FPGA core. Positive data input line 30 is coupled to positive I/O pad 60 through a first two-input multiplexer 66 and a second two-input multiplexer 72. Positive data input line 30 is coupled directly to a first input of two-input multiplexer 66 and coupled to a second input of two-input multiplexer 66 through the positive side of two-input differential amplifier 64. The negative side of differential amplifier 64 may be connected to a reference voltage 84 or negative I/O pad data line 68. The output of differential amplifier 64 is coupled to a second input of two-input multiplexer 66. The output of multiplexer 66 is coupled to a first input of two-input multiplexer 72 and to a second input of two-input multiplexer 72 through delay circuit 70. The output of multiplexer 72 forms positive data input line 30 that provides data input to the FPGA core.

Negative I/O cell 24 includes an inverter 42 which provides a signal line to multiplexer 44. Multiplexer 44 selects a signal to be routed to negative output buffer 52 via boundary scan register 48. As set forth above, boundary scan register 48 is only used in testing mode to test the I/O circuitry. In normal mode boundary scan register 48 is bypassed. Output buffer 52 is used to drive the signal received by buffer 52 from multiplexer 44 to negative I/O pad 62. The LVDS driver is discussed in greater detail below.

Also shown is negative input data line 36 which carries signals between negative I/O pad 62 to the FPGA core. Negative data input line 36 is coupled to negative I/O pad 62 through a first two-input multiplexer 76 and a second two-input multiplexer 80. Negative data input line 36 is coupled directly to a first input of two-input multiplexer 76 and coupled to a second input of two-input multiplexer 76 through the positive side of two-input differential amplifier 74. The negative side of differential amplifier 74 may be connected to a reference voltage 82. The output of differential amplifier 74 is coupled to a second input of two-input multiplexer 76. The output of multiplexer 76 is coupled to a first input of two-input multiplexer 80 and to a second input of two-input multiplexer 80 through delay circuit 78. The output of multiplexer 80 forms negative data input line 36 that provides data input to the FPGA core.

Figure 3:
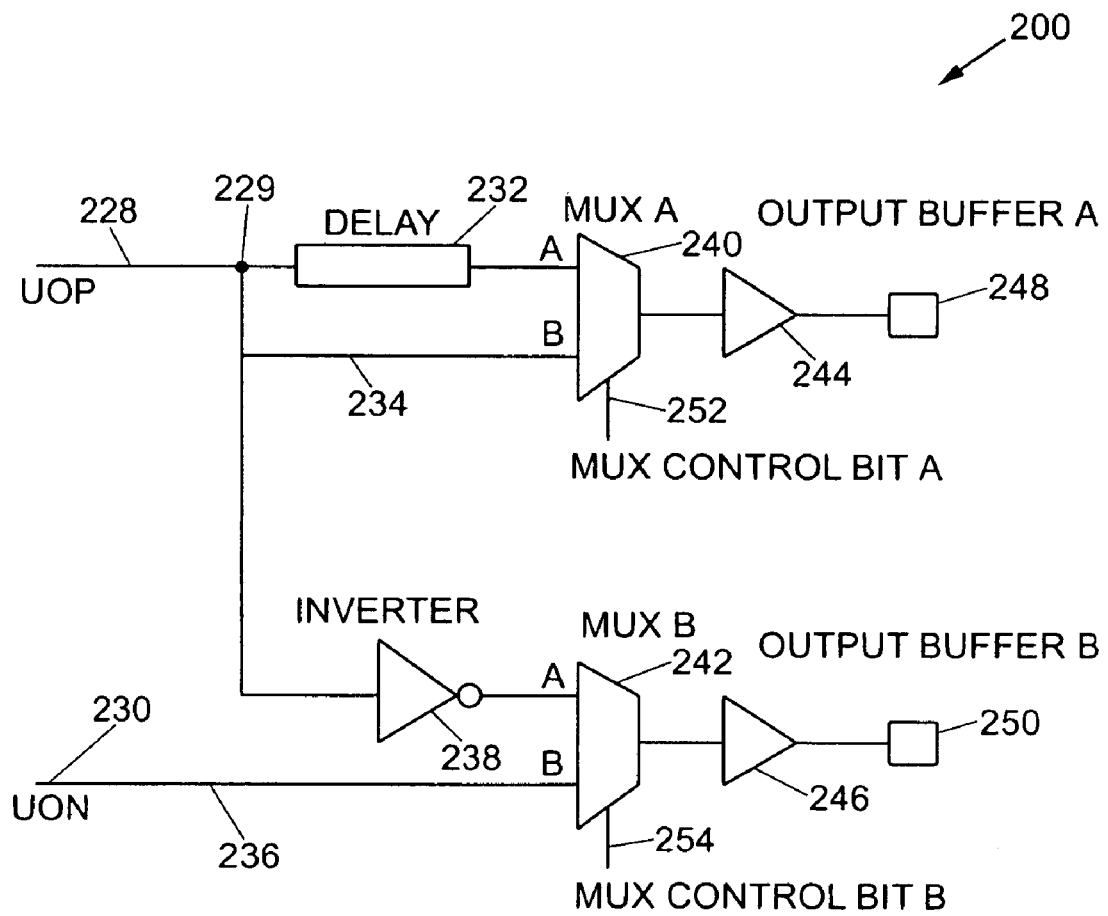
FIG. 3 is a block diagram illustrating in further detail the LVDS driver of the I/O cell as shown in FIG. 2.

FIG. 3 shows LVDS driver 200 according to an embodiment of the present invention. Two adjacent output buffers are used to construct LVDS driver 200. Positive output data line 228 is coupled to multiplexer 240 through inputs A and B. Negative output data line 230 is coupled to multiplexer 242 by input B. If the B input of multiplexers 240 and 242 is selected, output buffer 248 and output buffer 250 will function independently providing for an extremely flexible device. The multiplexer selection signals are controlled by programmable elements 252 and 254. As readily apparent to those skilled in the relevant art, programmable elements 252 and 254 can be any of a number of programmable elements for example, antifuse, electrical erasable PROM cells, SRAM cells, etc.

When the A inputs of multiplexers 240 and 242 are selected a LVDS driver is formed. If the LVDS driver is formed by choosing the A inputs of multiplexers 240 and 242, negative output data line 230 is not used. Positive data output line 228 is used to control LVDS driver 200. Positive data output line 228 is coupled to the A input of multiplexer 240 through delay circuit 232. The output of multiplexer 240 is coupled to the input of output buffer 244. The output of output buffer 244 is coupled to the input of positive I/O pad 248. Positive data output line 228 is also coupled to the A input of multiplexer 242 through programmable element 229 and inverter 238. The output of multiplexer of multiplexer 242 is coupled to the input of output buffer 246. The output of output buffer 246 is coupled to the input of negative I/O pad 250.

Figure 4:
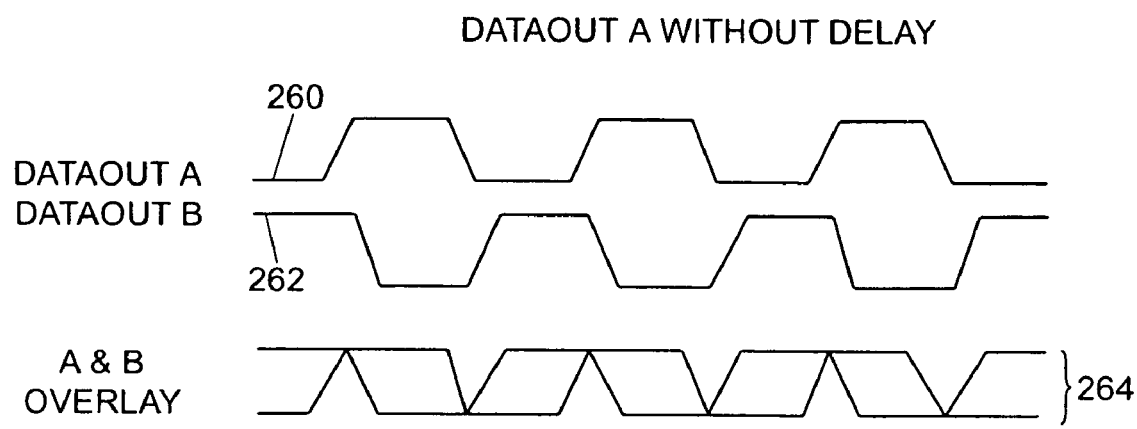
FIG. 4 is a timing diagram illustrating the signal pattern of the I/O without a delay.
Figure 5:
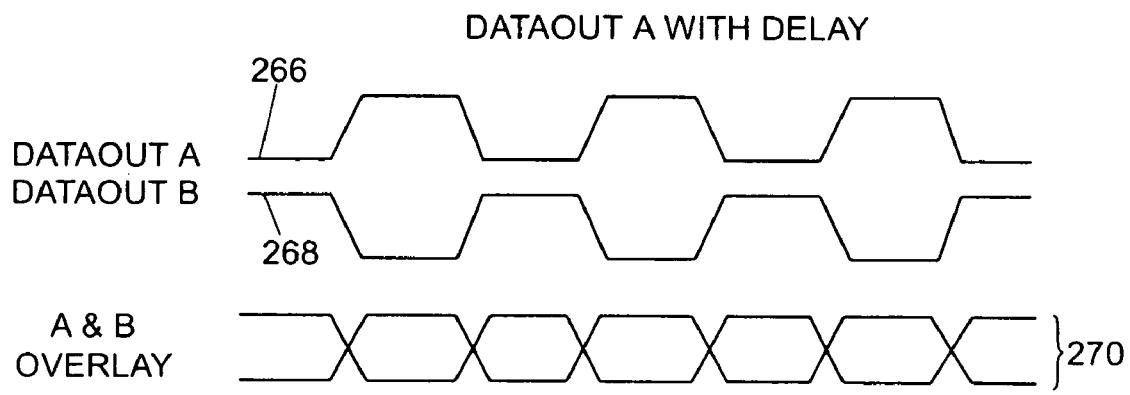
FIG. 5 is a timing diagram illustrating the signal pattern of the I/O incorporating the LDVS driver as shown in FIG. 3.

As shown in FIGS. 3 and 4, the timing skew between Dataout A 260 from output buffer 248 and Dataout B 262 from output buffer 250 is large as further shown in A and B overlay 264. However, as shown in FIGS. 4 and 5, the timing skew of the LDVS driver of the present invention is minimized. FIGS. 4 and 5 show Dataout A 266 and Dataout B 268 and the overlay of Dataout A and Dataout B 270. The overlay of Dataout A and Dataout B 270 demonstrates how the timing skew is minimized.

From this disclosure, it will be apparent to persons of ordinary skill in the art that various alternatives to the embodiments of the invention described herein may be employed in practicing the invention. It is intended that the following claims define the scope of the invention and that structures and methods within the scope of these claims and their equivalents be covered thereby.

What is claimed is:

1. A low voltage differential signaling driver comprising:
   a first output buffer;
   a second output buffer;
   a first output line;
   a second output line;
   a delay circuit connected to said first output line;
   an inverter connected to said first output line;
   a first multiplexer having a first input connected to an output of said delay circuit, a second input connected to said first output line and an output connected to said first output buffer;
   a second multiplexer having a first input connected to an output of said inverter, a second input connected to said second output line and an output connected to said second output buffer; and
   control circuitry connected to said first multiplexer and said second multiplexer to determine which one of said first and second input of said first multiplexer is applied to said output of said first multiplexer and which one of said first input and said second input of said second multiplexer are applied to said output of said second multiplexer.

* * * * *